United States Patent
Lim et al.

(10) Patent No.: US 7,867,841 B2
(45) Date of Patent: Jan. 11, 2011

(54) METHODS OF FORMING SEMICONDUCTOR DEVICES WITH EXTENDED ACTIVE REGIONS

(75) Inventors: Dong-Chan Lim, Yongin-si (KR); Byeong-Yun Nam, Hwaseong-si (KR); Soo-Ik Jang, Hwaseong-si (KR); In-Soo Jung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 349 days.

(21) Appl. No.: 11/968,242

(22) Filed: Jan. 2, 2008

(65) Prior Publication Data

US 2008/0157262 A1 Jul. 3, 2008

(30) Foreign Application Priority Data

Jan. 2, 2007 (KR) .................... 10-2007-0000243

(51) Int. Cl.
*H01L 21/8238* (2006.01)
(52) U.S. Cl. ............ 438/222; 438/360; 438/413; 257/E21.09
(58) Field of Classification Search ............. 438/41, 438/44, 222, 269, 360, 413, 481; 257/E21.09
See application file for complete search history.

(56) References Cited

U.S. PATENT DOCUMENTS

| 6,683,364 B2 * | 1/2004 | Oh et al. ............ 257/510 |
| 7,193,276 B2 | 3/2007 | Lim et al. |
| 2004/0070023 A1 * | 4/2004 | Kim et al. .......... 257/315 |
| 2004/0070033 A1 * | 4/2004 | Shin .................. 257/379 |
| 2006/0022299 A1 | 2/2006 | Seo |
| 2006/0073662 A1 | 4/2006 | Jang et al. |

(Continued)

FOREIGN PATENT DOCUMENTS

JP 2000-31480 A 1/2000

(Continued)

*Primary Examiner*—Jerome Jackson, Jr.
*Assistant Examiner*—Paul A Budd
(74) *Attorney, Agent, or Firm*—Myers Bigel Sibley & Sajovec, P.A.

(57) ABSTRACT

A method of forming a semiconductor device can include forming a trench in a semiconductor substrate to define an active region. The trench is filled with a first device isolation layer. A portion of the first device isolation layer is etched to recess a top surface of the first device isolation layer below an adjacent top surface of the active region of the semiconductor substrate and to partially expose a sidewall of the active region. The exposed sidewall of the active region is epitaxially grown to form an extension portion of the active region that extends partially across the top surface of the first device isolation layer in the trench. A second device isolation layer is formed on the recessed first device isolation layer in the trench. The second device isolation layer is etched to expose a top surface of the extension portion of the active region and leave a portion of the second device isolation layer between extension portions of active regions on opposite sides of the trench. An interlayer dielectric is formed on the semiconductor substrate and the second device isolation layer. A conductive contact is formed extending through the interlayer dielectric layer and directly contacting at least a portion of both the active region and the extension portion of the active region overlying the second device isolation layer.

12 Claims, 7 Drawing Sheets

U.S. PATENT DOCUMENTS

2007/0128789 A1  6/2007  Lim et al.

FOREIGN PATENT DOCUMENTS

| KR | 10-2005-0045599 | | 5/2005 |
|---|---|---|---|
| KR | 10-2005-0045599 | A | 5/2005 |
| KR | 10-2005-0047274 | A | 5/2005 |
| KR | 10-2005-0056342 | A | 6/2005 |
| KR | 10-2006-0011418 | | 2/2006 |
| KR | 10-2006-0029549 | A | 4/2006 |

* cited by examiner

METHODS OF FORMING SEMICONDUCTOR DEVICES WITH EXTENDED ACTIVE REGIONS

CROSS-REFERENCE TO RELATED APPLICATIONS

This U.S. non-provisional patent application claims priority under 35 U.S.C. §119 of Korean Patent Application No. 10-2007-0000243, filed on Jan. 2, 2007, the entire contents of which are herein incorporated by reference in their entirety.

BACKGROUND OF THE INVENTION

The present invention relates to methods of forming semiconductor devices, and more particularly, to methods of forming active regions on semiconductors substrates and to related semiconductor devices.

Continued advances in semiconductor technologies are providing higher speed and higher integration of semiconductor devices. As the integration of semiconductor device increases, feature patterns therein are becoming finer and chip size is being reduced. Relatedly, the size of active regions for the device features are being reduced, which can lead to fabrication and operational problems. For example, when a storage contact is formed on an active region in a DRAM device, it can become increasingly difficult to obtain a sufficient contact margin as the size of the active region decreases. An insufficient contact margin can deteriorate the operation characteristics, such as refresh characteristics, and reliability of the device.

SUMMARY OF THE INVENTION

Some exemplary embodiments of the present invention provide a method of forming a semiconductor device. The method can include forming a trench in a semiconductor substrate to define an active region. The trench is filled with a first device isolation layer. A portion of the first device isolation layer is etched to recess a top surface of the first device isolation layer below an adjacent top surface of the active region of the semiconductor substrate and to partially expose a sidewall of the active region. The exposed sidewall of the active region is epitaxially grown to form an extension portion of the active region that extends partially across the top surface of the first device isolation layer in the trench. A second device isolation layer is formed on the recessed first device isolation layer in the trench. The second device isolation layer is etched to expose a top surface of the extension portion of the active region and leave a portion of the second device isolation layer between extension portions of active regions on opposite sides of the trench. An interlayer dielectric is formed on the semiconductor substrate and the second device isolation layer. A conductive contact is formed extending through the interlayer dielectric layer and directly contacting at least a portion of both the active region and the extension portion of the active region overlying the second device isolation layer.

Some other exemplary embodiments of the present invention provide a method of forming a semiconductor device that includes forming a first device isolation layer in a semiconductor substrate to define an active region extending in a first direction. A sidewall of the active region is partially exposed. The exposed sidewall of the active region is epitaxially grown to form an extension portion of the active region.

Some other exemplary embodiments of the present invention provide a semiconductor device that includes a semiconductor substrate with a trench defined therein that extends in a first direction. A first device isolation layer fills a lower portion of the trench. Active regions in the semiconductor substrate on opposite adjacent sides of the first device isolation layer have extension portions that extend partially across a top surface of the first device isolation layer in the trench. A second device isolation layer is on the first device isolation layer in the trench and extends between sidewalls of the extension portions of the active regions that extend onto the top surface of the first device isolation layer.

BRIEF DESCRIPTION OF THE FIGURES

FIGS. 2A to 7A are top plan views illustrating methods of forming a semiconductor device in accordance with some embodiments of the present invention.

FIGS. 2B to 7B are cross-sectional views taken along the line I-I' of FIGS. 2A to 7A, respectively.

DETAILED DESCRIPTION OF PREFERRED EMBODIMENTS

Figure 1A:
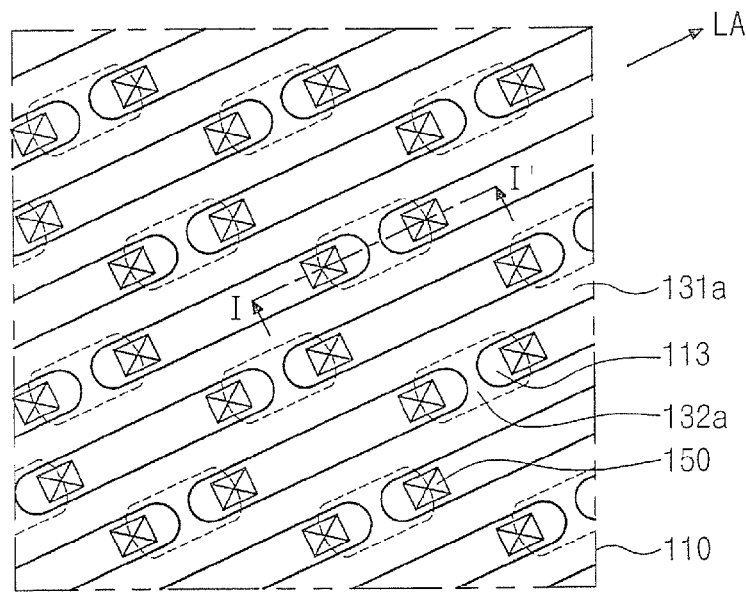
FIG. 1A is a top plan view of a semiconductor device in accordance with some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1B:
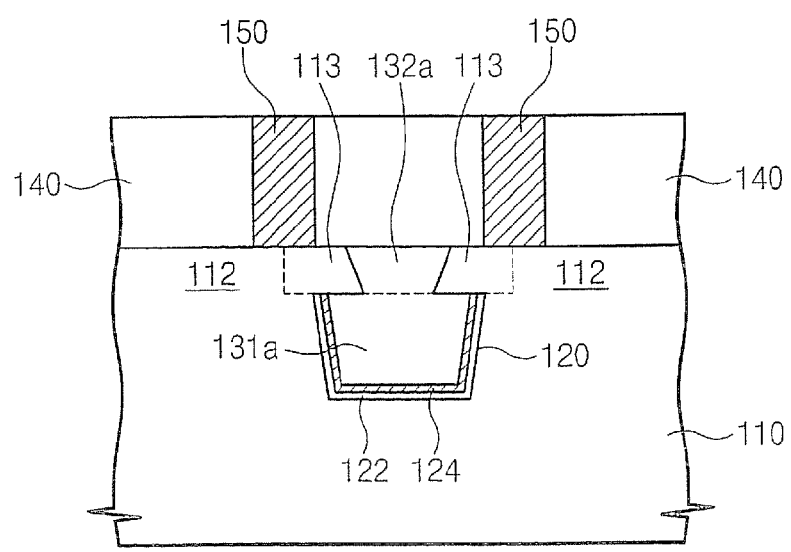
FIG. 1B is a cross-sectional view taken along the line I-I' of FIG. 1A.

Referring to FIGS. 1A and 1B, a semiconductor substrate 110 includes device isolation layers 131a and 132a that define an active region 112. The device isolation layers 131a and 132a may include a partially recessed first device isolation layer 131a and a second device isolation layer 132a disposed on the recessed first device isolation layer 131a. The first device isolation layer 131a and the second device isolation layer 132a may include different materials having different characteristics from one another. The first device isolation layer 131a may include a material, such as spin-on-glass (SOG), having a superior gap-fill characteristic than the second device isolation layer 132a. The second device isolation layer 132a may include a material, such as high-density plasma (HDP) oxide, having a resistance against wet etching by phosphoric acid or the like.

The active region 112 includes an extension portion 113 extending onto a top surface of the first device isolation layer 131a. The extension portion 113 may be epitaxially grown from the active region 112 in a first direction LA shown in FIG. 1A. The second device isolation layer 132a may be between opposite facing sidewalls of adjacent extension portions 113. Accordingly, opposite facing sidewalls of adjacent extension portions 113 can contact respective opposite facing sidewalls of the second device isolation layer 132a. The active region 112, the extension portion 113, and the second isolation layer 132a may have aligned top surfaces.

A contact 150 is on the extension portion 113 and electrically connected therethrough to the active region 112. For example, the contact 150 may function as a storage contact penetrating an interlayer dielectric 140 to electrically connect an overlying storage electrode (not shown) to the active region 112.

Accordingly, the effective size of the active region 112 is extending in the first direction LA because of the extension portion 113. Consequently, the available contact area between the active region 112 and the overlying contact 150 is increased, which may improve operational characteristics and/or reliability of the associated semiconductor device.

Figure 2A:
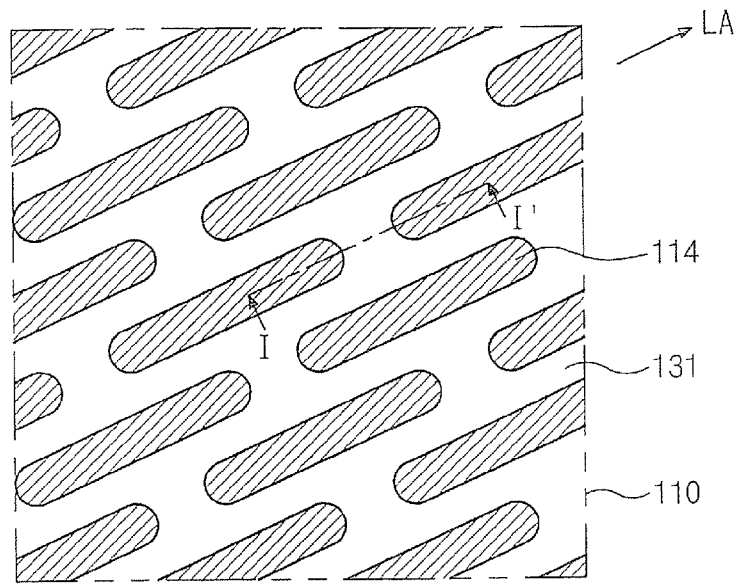
Figure 2B:
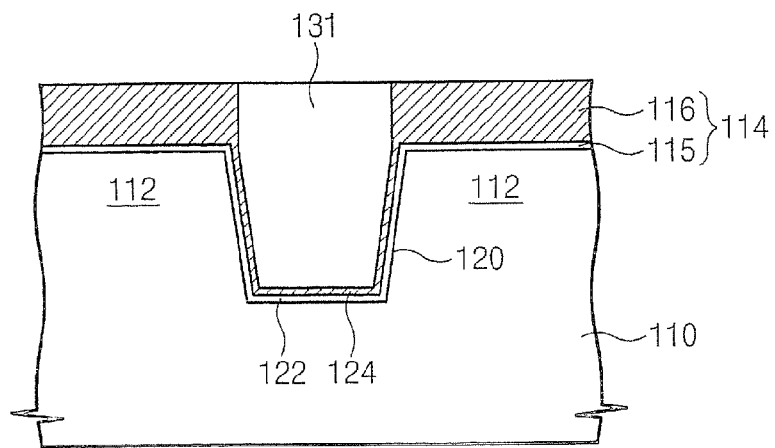

Referring to FIGS. 2A to 2B, a mask pattern 114 is formed on the semiconductor substrate 110 and extends in the first direction LA. The semiconductor substrate 110 may be formed as, for example, a single-crystalline silicon substrate or a silicon on insulator (SOI) substrate, etc. The shape of the mask pattern 114 can correspond to a desired shape of the active region 112 of the semiconductor substrate 110, and may include an oxide pattern 115 and a nitride pattern 116. The oxide pattern 115 can function as a pad oxide layer to alleviate a stress that may occur between the semiconductor substrate 110 and the nitride pattern 116, and may be formed by a thermal oxidation process.

The semiconductor substrate 110 is etched using the mask pattern 114 as a mask to form a trench 120. The active region 112 is defined in the semiconductor substrate 110 by the trench 120 to extend in the first direction LA. A thermal oxide layer 122 may be formed on an inner sidewall of the trench 120 to at least partially cure etching damage, and a nitride liner 124 may be formed on the thermal oxide layer 122.

The trench 120 can be filled with an insulating material, and a planarization process can be performed to expose a top surface of the mask pattern 115 and leave a first device isolation layer 131 in the trench 120. The first device isolation layer 131 may be formed from a material having excellent gap-fill characteristic, such as SOG, using a spin coating process.

Figure 3A:
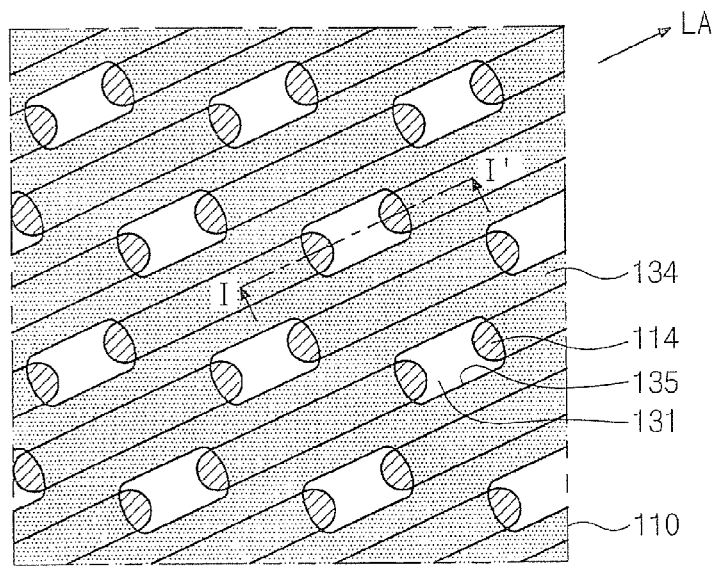
Figure 3B:
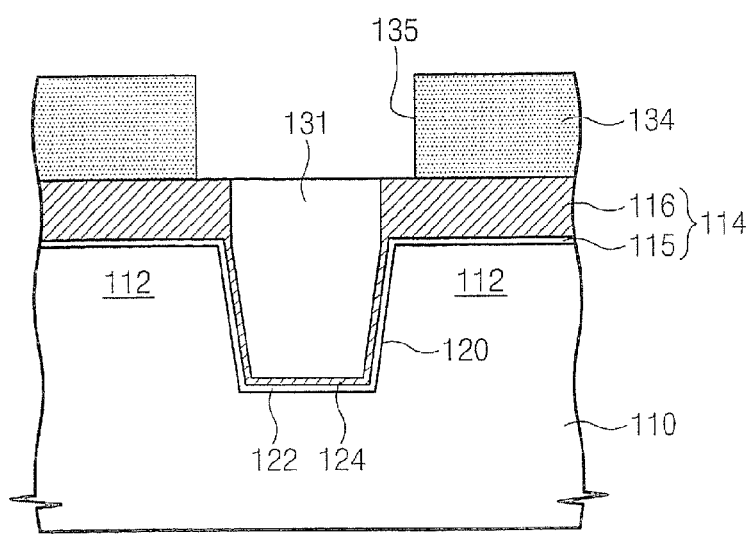

Referring to FIGS. 3A and 3B, a photoresist pattern 134 including an intaglio pattern 135 is formed on the mask pattern 114 and the first device isolation layer 131. The intaglio pattern 135 may have various shapes and serve to define the extension portion of the active region 112, as will be described later. For example, the intaglio pattern 135 can expose the first device isolation layer 131 between the adjacent active regions 112 along the first direction LA. The intaglio pattern 135 may also expose edge portions of the mask pattern 114.

The photoresist pattern 134 is not limited to having the exemplary intaglio pattern 135, as its shape and/or pattern defined therein can be based on the shape and the layout of the active regions 112. For example, the photoresist pattern 134 may be formed having a linear shape.

Figure 4A:
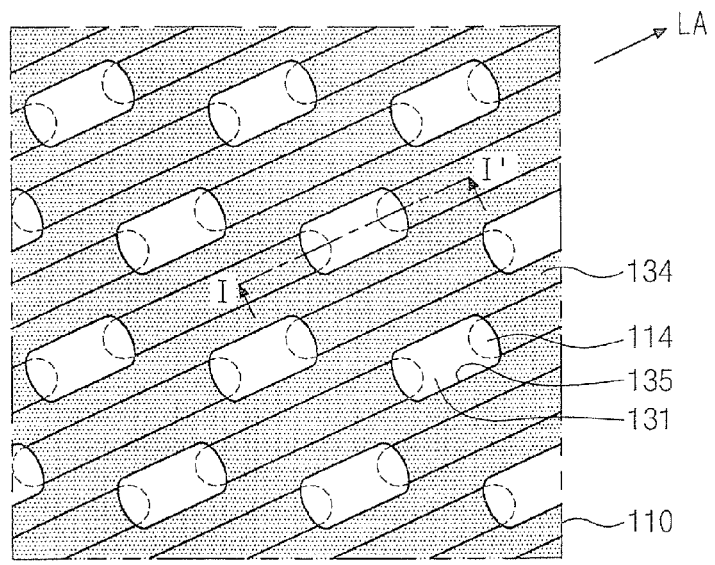
Figure 4B:
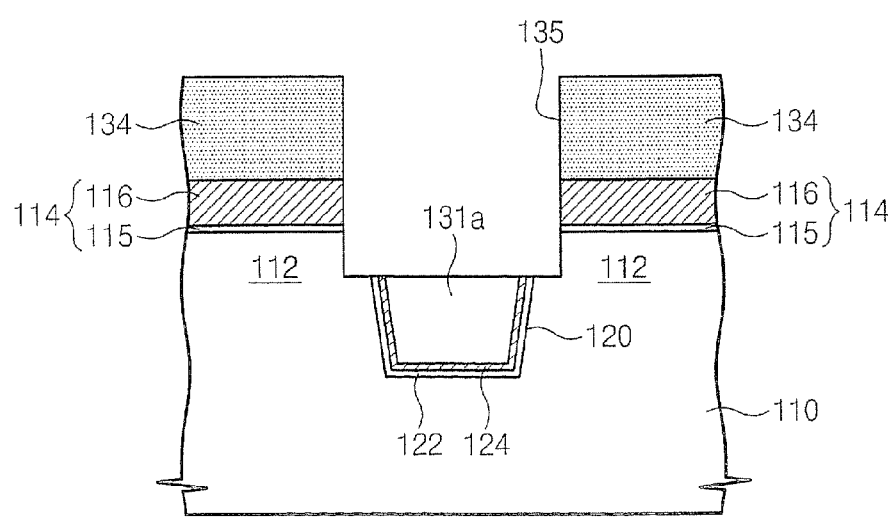

Referring to FIGS. 4A and 4B, an etching process is performed using the photoresist pattern 134 as an etch mask to recess the first device isolation layer 131. A portion of the mask pattern 114 exposed by the intaglio pattern 135 and the underlying active region 112 may also be etched during the etching process, thereby enlarging a width of an upper portion of the trench 120. The first device isolation layer 131, the nitride liner 124, the thermal oxide layer 122, and the active region 112 may be successively etched to recess the top surface of the first device isolation layer 131a below a top surface of the active region 112. The photoresist pattern 134 may be removed using an ashing process.

Figure 5A:
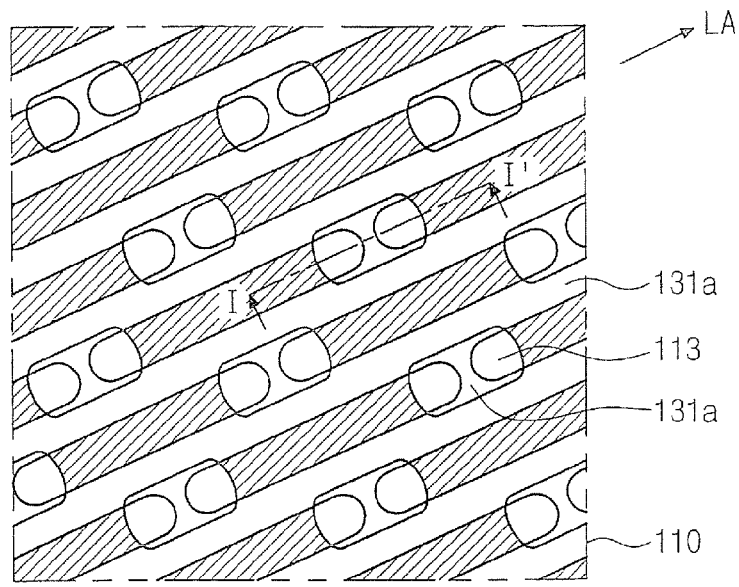
Figure 5B:
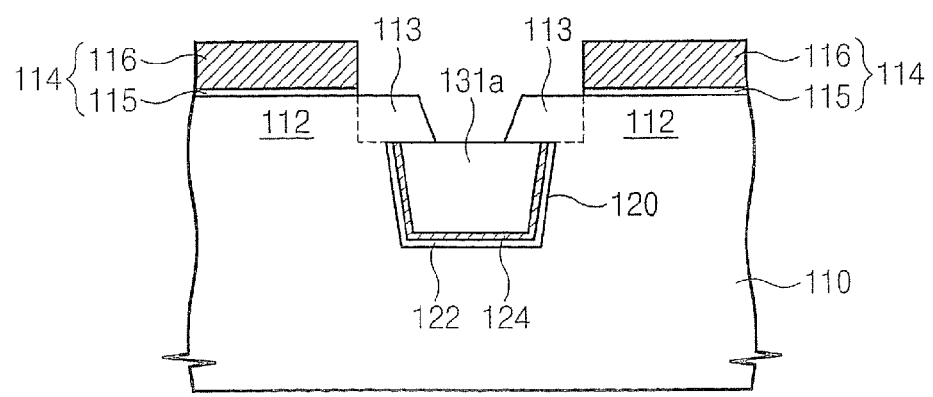

Referring to FIGS. 5A and 5B, the exposed sidewall of the active region 112 is epitaxially grown to form an extension portion 113 extending in a first direction. The extension portion 113 may be formed to extend onto a portion of the top surface of the recessed first device isolation layer 131a. The epitaxial growth of the active region 112 may include growth in the illustrated vertical-direction and lateral growth along the first direction LA. The epitaxial growth in the first direction LA can occur at a higher rate than the epitaxial growth in the vertical-direction. Accordingly, a ratio of the growth rate in the first direction LA to the growth rate in the vertical-direction may be greater than 1:1. If the ratio of the growth rates is too low, the extension portion 113 may be formed improperly with excessive upward growth and insufficient lateral growth. In contrast, if the ratio of the growth rates is too high, the extension portion 113 may extend across the first device isolation layer 131a and undesirably connect to each other (i.e., electrically interconnecting the active regions 112 on opposite sides of the first device isolation layer 131a). Thus, the ratio of the growth rates can be regulated to provide a desired thickness and width of the extension portion 113. In some embodiments, the ratio of the growth rate in the first direction LA to the growth rate in the illustrated vertical-direction may be approximately 1:2.5.

Accordingly, the extension portion 113 effectively extends the width of the active region 112 along the first direction LA, and the extended width may be more effectively controlled than what may be possible using a photoresist and an etching process. When these processes are used in a DRAM device, increased margin can be provided for connecting a storage contact to an edge portion of the active region 112, which may enhance operational and/or reliability characteristics of the device.

Figure 6A:
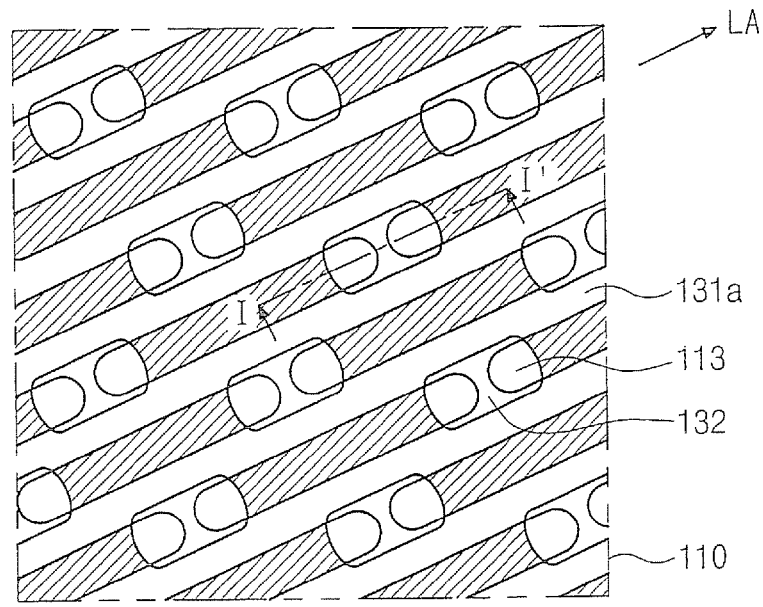
Figure 6B:
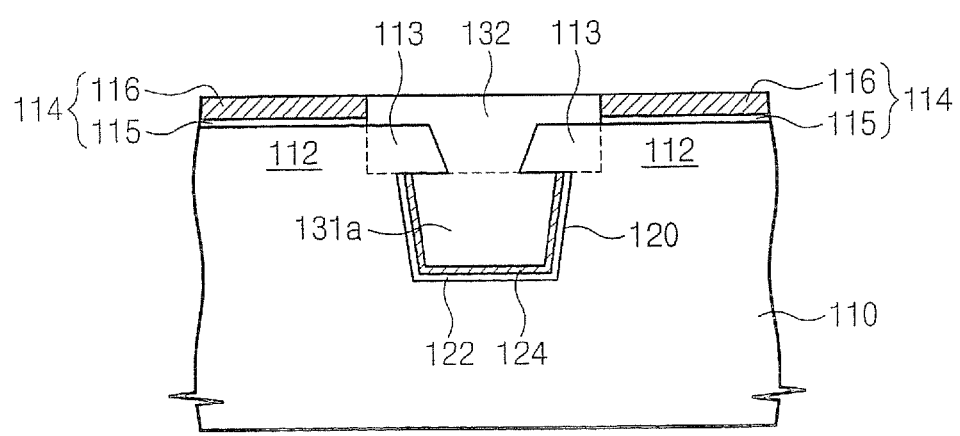

Referring to FIGS. 6A and 6B, an insulating layer 132 is formed to cover the extension portions 113 and the first device isolation layer 131a between the mask patterns 114. The insulating layer 132 may be formed from a material having an etching selectivity with respect to the nitride pattern 116 and having different properties from the material of the first device isolation layer 131a. For example, the insulating layer 132 may be formed from high-density plasma (HDP) oxide using a chemical vapor deposition (CVD) process.

The width thickness of the mask pattern 114 may be reduced by performing a planarization process. The mask pattern 114 and the device isolation layer 132 may be formed to have aligned top surfaces.

Figure 7A:
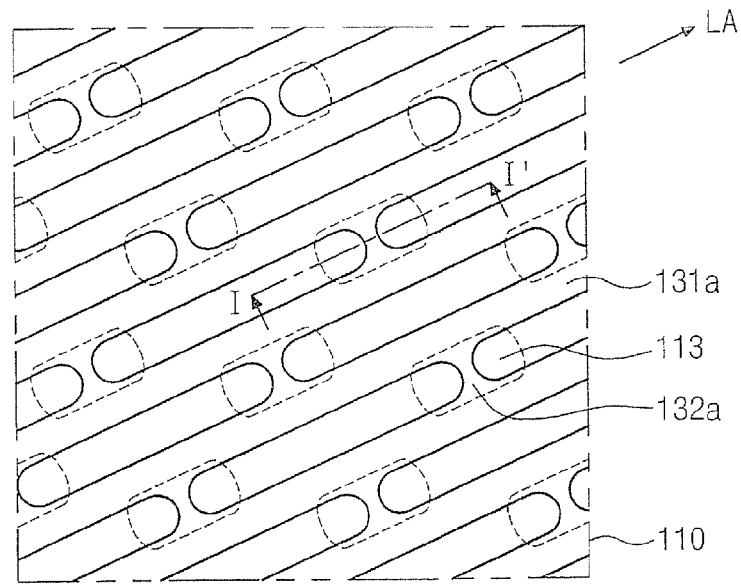
Figure 7B:
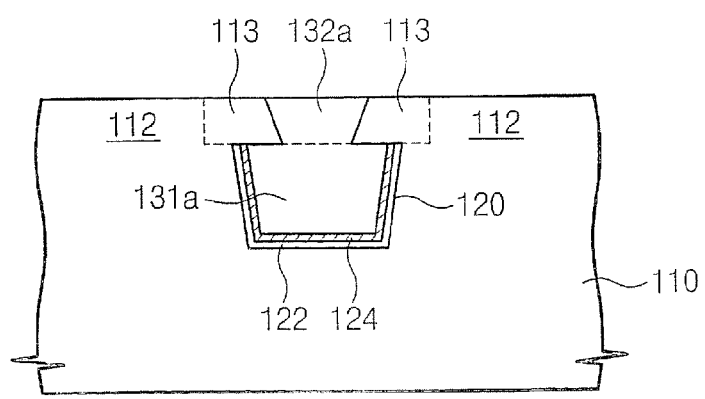

Referring to FIGS. 7A and 7B, an etching process is performed to remove an upper portion of the insulating layer 132, remove the mask pattern 114, and expose the top surfaces of the active region 112 and the extension portion 113. The remaining insulating layer 132 is recessed below the top surfaces of the active region 112 and the extension portion 113 so as to form a second device isolation layer 132a between the extension portions 113. For example, the etching process may include etching the insulating layer 132 using a hydrofluoric acid (HF) solution and etching the nitride layer pattern 116 using a phosphoric acid solution.

The active region 112, the extension portion 113, and the second device isolation layer 132a may be formed using etching process to have aligned top surfaces.

In this manner, some embodiments of the present invention provide a device isolation layer between adjacent active regions in the first direction LA. The device isolation layer includes the recessed first device isolation layer 131a with the second device isolation layer 132a stacked thereon. Because the recessed first device isolation layer 131a is formed of an insulating material having a superior gap-fill characteristic, it may be more easily formed without voids. Moreover, because the second device isolation layer 132a has a low height to width aspect ratio by it being formed on the first device isolation layer 131a, the second device isolation layer 132a may be more easily formed without voids. In contrast to these exemplary embodiments, if the device isolation layer was formed as a single layer using a photoresist and etching process, the resulting increased aspect ratio of the device isolation layer may increase formation of associated voids.

While the present invention has been particularly shown and described with respect to exemplary embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims and equivalents thereof.

What is claimed is:

1. A method of forming a semiconductor device comprising:
   forming a first device isolation layer in a semiconductor substrate to define an active region extending in a first direction;
   partially exposing a sidewall of the active region; and
   epitaxially growing the exposed sidewall of the active region to form an extension portion of the active region,
   wherein the extension portion of the active region is epitaxially grown at a higher rate laterally along the first direction than upwardly away from the semiconductor substrate.

2. A method of forming a semiconductor device comprising:
   forming a first device isolation layer in a semiconductor substrate to define an active region extending in a first direction;
   partially exposing a sidewall of the active region; and
   epitaxially growing the exposed sidewall of the active region to form an extension portion of the active region,
   wherein partially exposing the sidewall of the active region comprises recessing a portion of the first device isolation layer so that a top surface of the first device isolation layer is below an adjacent top surface of the active region including by forming a photoresist pattern including an intaglio pattern on the semiconductor substrate where the first device isolation layer is formed, and etching a portion of the first device isolation layer using the photoresist pattern as a etch mask.

3. The method of claim 2, wherein, when the portion of the first device isolation layer is etched, a portion of the sidewall of the active region is etched to enlarge separation between opposite facing sidewalls of the active region.

4. The method of claim 2, wherein the intaglio pattern exposes the first device isolation layer between the adjacent active regions in the first direction.

5. The method of claim 4, wherein forming the first device isolation layer comprises:
   forming a mask pattern on the semiconductor substrate that corresponds to the active region;
   forming a trench in the semiconductor substrate using the mask pattern as an etch mask; and
   filling the trench with a first insulating layer,
   wherein the photoresist pattern is formed on the mask pattern and the first insulating layer.

6. The method of claim 5, wherein the first insulating layer is formed by a spin coating process.

7. The method of claim 5, further comprising:
   forming a second device isolation layer on the recessed device isolation layer between the extension portions.

8. The method of claim 7, wherein the second device isolation layer has an etch selectivity with respect to the mask pattern.

9. The method of claim 7, wherein forming the second device isolation layer comprises:
   forming a second insulating layer on the recessed device isolation layer between the extension portions;
   etching the second insulating layer to expose the top surface of the extension portion; and
   etching the mask pattern to expose the top surface of the active region.

10. The method of claim 9, wherein the top surface of the second device isolation layer, the top surface of the extension portion, and the top surface of the active region are aligned.

11. The method of claim 7, wherein the first device isolation layer and the second device isolation layer are formed from different materials.

12. A method of forming a semiconductor device comprising:

forming a trench in a semiconductor substrate to define an active region;

filling the trench with a first device isolation layer;

etching a portion of the first device isolation layer to recess a top surface of the first device isolation layer below an adjacent top surface of the active region of the semiconductor substrate and to partially expose a sidewall of the active region, wherein the etching of the portion of the first device isolation layer comprises forming a photoresist pattern including an intaglio pattern on the semiconductor substrate where the first device isolation layer is formed, and etching the portion of the first device isolation layer using the photoresist pattern as an etch mask;

epitaxially growing the exposed sidewall of the active region to form an extension portion of the active region that extends partially across the top surface of the first device isolation layer in the trench;

forming a second device isolation layer on the recessed first device isolation layer in the trench;

etching the second device isolation layer to expose a top surface of the extension portion of the active region and leave a portion of the second device isolation layer between extension portions of active regions on opposite sides of the trench;

forming an interlayer dielectric on the semiconductor substrate and the second device isolation layer; and forming a conductive contact extending through the interlayer dielectric layer and directly contacting at least a portion of both the active region and the extension portion of the active region overlying the second device isolation layer.

* * * * *